US008525972B2

(12) United States Patent
Michaloski (10) Patent No.: US 8,525,972 B2
(45) Date of Patent: Sep. 3, 2013

(54) OPTIMIZATION OF FOCUSED SPOTS FOR MASKLESS LITHOGRAPHY (75) Inventor: Paul Francis Michaloski, Rochester, NY (US)

(73) Assignee: Corning Incorporated, Corning, NY (US)

(*) Notice: Subject to any disclaimer, the term of this patent is extended or adjusted under 35 U.S.C. 154(b) by 1040 days.

(21) Appl. No.: 12/511,345

(22) Filed: Jul. 29, 2009

(65) Prior Publication Data
US 2010/0039630 A1 Feb. 18, 2010

Related U.S. Application Data (60) Provisional application No. 61/085,390, filed on Jul. 31, 2008.

(51) Int. Cl.
*G03B 27/72* (2006.01)

(52) U.S. Cl.
USPC .............................. 355/71; 355/67

(58) Field of Classification Search
USPC ............... 355/53, 67, 71; 359/224, 291, 642, 359/663, 855; 430/5, 30, 296, 311; 347/241
See application file for complete search history.

(56) References Cited

U.S. PATENT DOCUMENTS

| | | | |
|---|---|---|---|
| 5,786,582 A * | 7/1998 | Roustaei et al. ......... 235/462.07 |
| 6,667,796 B1 * | 12/2003 | Nishi ............................. 355/30 |
| 2002/0097495 A1 | 7/2002 | Mei | |
| 2002/0105629 A1 * | 8/2002 | Sandstrom et al. ............ 355/71 |
| 2002/0154284 A1 * | 10/2002 | Sato .................................. 355/71 |
| 2003/0128344 A1 * | 7/2003 | Nishi ............................. 355/52 |
| 2004/0196526 A1 | 10/2004 | Roxlo et al. | |
| 2005/0191583 A1 * | 9/2005 | Noguchi et al. .............. 430/311 |

FOREIGN PATENT DOCUMENTS

| | | |
|---|---|---|
| EP | 1480086 A1 | 11/2004 |
| TW | 200506547 | 2/2005 |
| WO | 03038518 A1 | 5/2003 |

OTHER PUBLICATIONS

Ren Yang et al. in "Design and fabrication of microlens and spatial filter array by self-alignment for maskless lithography systems," SPIE, J. Microlith., Microfab., Microsyst., vol. 2 No. 3, 210-219, Jul. 2003.
U.S. Appl. No. 61/130,363, filed May 30, 2008 entitled "Illumination System for Sizing Focused Spots of a Patterning System for Maskless Lithography" by Joshua M. Cobb.

* cited by examiner

*Primary Examiner* — Toan Ton
*Assistant Examiner* — Mona M Sanei
(74) *Attorney, Agent, or Firm* — Timothy M. Schaeberle (57) ABSTRACT The focused spots of an active spot array projection system, such as a maskless lithographic projection system, are optimized within a relay of the projection system. A frequency modulator is positioned proximate to the pupil of the relay for reforming the focused spots while imaging the focused spots onto a photosensitive substrate.

23 Claims, 5 Drawing Sheets

OPTIMIZATION OF FOCUSED SPOTS FOR MASKLESS LITHOGRAPHY

CROSS-REFERENCE TO RELATED APPLICATIONS

This application claims the benefit of priority under 35 U.S.C. §119(e) of U.S. Provisional Application Ser. No. 61/085,390 filed on Jul. 31, 2008.

TECHNICAL FIELD

Within systems for producing controllable patterns of focused spots, such as projection systems for maskless lithography, the invention relates to the optimization of the focused spots.

BACKGROUND OF THE INVENTION

Spatial light modulators together with adapted projection systems of so-called "maskless" lithographic systems replace reticles of conventional lithographic systems to provide for imaging onto photosensitive substrates patterns that are not limited by the physical boundaries or particular patterns of the reticles. Instead of imaging static patterns within the reticles, the maskless lithographic systems image dynamic patterns of focused spots that are individually switched between on and off states while being translated across the photosensitive substrates.

The spatial light modulators include an array of elements that are individually addressable for functioning as light switches that control a spatial distribution of light. The associated projection system focuses light regulated by each of the elements into a pattern of focused spots, which is relayed (or imaged directly) onto the photosensitive substrates. Typically, the projection system forms a magnified image of each of the individually addressable elements on corresponding microlenses of a microlens array, and the individual microlenses of the microlens array concentrate the light from the individual addressable elements through the focused spots.

Although both the focusing and magnification functions result in the focused spots being spaced apart, the pattern of focused spots includes multiple rows of focused spots and is oriented at a slight angle to a direction of translation with respect to the substrate so that successive rows of the focused spots provide for selectively illuminating any desired point on the substrate. The resolution at which a pattern can be printed onto the substrate relates to the size and shape of the focused spots as well as the radial distribution of light within the focused spots.

SUMMARY OF THE INVENTION

The invention, among its preferred embodiments of focal spot patterning systems, provides for optimizing the focused spots between a position at which the spots are first formed and a position at which the spots are imaged onto photosensitive substrates. The spots can be collectively optimized by various apodization or phase adjusting techniques applied within a pupil of a relay lens for imaging patterns of the focused spots onto the photosensitive substrate. Some differential optimization of the focused spots within the imaged pattern of the focused spots can be carried out by similar apodization or phase adjusting techniques applied offset from the relay's pupil. The optimization techniques can be used to correct the overall shape of the spots or to redistribute energy within the spots for such purposes as sharpening the boundaries of the spots. The optimization of the spots can also improve the depth of focus of the spots by reducing the variation of the spot with defocus.

One expression of the invention as a focal spot patterning system includes an illuminator for illuminating addressable elements of a pattern generator. An imager images the addressable elements of the pattern generator onto corresponding focusing elements that form focused spots in a pattern controlled by the pattern generator. A relay relays an image of the pattern of focused spots, each containing a range of spatial frequencies, onto a photosensitive substrate. A frequency modulator proximate to a pupil of the relay collectively modulates selected spatial frequencies of the focused spots.

The frequency modulator can be an apodizer for attenuating light over certain spatial frequencies asymmetrically about an optical axis of the relay to radially balance spatial frequency distributions within the relay pupil or to at least reduce asymmetric distributions of light over a range of spatial frequencies within the relay pupil. The asymmetric attenuations can also be used to change the shape of the focused spots. Alternatively, the apodizer can be arranged to attenuate light over certain spatial frequencies symmetrically about an optical axis of the relay for reducing the size of the focused spots, the depth of focus, or the side lobes of the focused spots imaged onto the substrate.

The frequency modulator can also be a phase plate located proximate to a pupil of the relay for delaying phases of certain spatial frequencies of the focused spots. The phase plate can be arranged for (a) asymmetrically delaying phases of certain spatial frequencies about an optical axis of the relay to reshape the focused spots imaged onto the substrate or (b) symmetrically delaying phases of certain spatial frequencies about an optical axis of the relay to reduce side lobes of the focused spots imaged onto the substrate or variations in defocus. In addition, the frequency modulator as either an attenuator or phase plate can be offset from the relay pupil along the optical axis of the relay for disproportionately modulating focused spots in one portion of the pattern of focused spots imaged onto the substrate with respect to another portion of the pattern of focused spots imaged onto the substrate.

Another expression of the invention is a method of reforming focused spots within a controllable pattern of focused spots. The individually addressable elements of a pattern generator are illuminated with the illuminator. The addressable elements of the pattern generator are imaged onto corresponding focusing elements for forming focused spots in a pattern controlled by the pattern generator. The pattern of focused spots, each containing a range of spatial frequencies, is relayed through a common pupil by a relay lens and onto a substrate at an image plane. Selected spatial frequencies of the focused spots are collectively modulated within the common pupil so that images of the focused spots onto the substrate at the image plane contain reformed angular distributions of light.

For example, certain spatial frequencies can be asymmetrically attenuated about an optical axis of the relay to radially balance spatial frequency distributions within the relay pupil or otherwise reduce asymmetric distributions of spatial frequencies within the relay pupil. Certain spatial frequencies can be symmetrically attenuated about an optical axis of the relay for reducing side lobes of the focused spots imaged onto the substrate image plane. Alternatively or additionally, certain spatial frequencies can be asymmetrically delayed in phase about an optical axis of the relay to reshape the focused spots imaged onto the substrate image plane or symmetrically delayed in phase to reduce side lobes of the focused spots imaged onto the substrate image plane or variations in defocus. A frequency modulator for attenuating or delaying the phase of certain spatial frequencies can be offset from the relay pupil for disproportionately modulating focused spots in one portion of the pattern of focused spots imaged onto the substrate image plane with respect to another portion of the pattern of focused spots imaged onto the substrate image plane. An orientation at which the imaged spots are elongated at the substrate image plane can be determined and spatial frequencies in an orthogonal orientation within the relay pupil can be attenuated to reform the imaged spots into a less elongated shape.

DETAILED DESCRIPTION OF THE INVENTION

Figure 1:
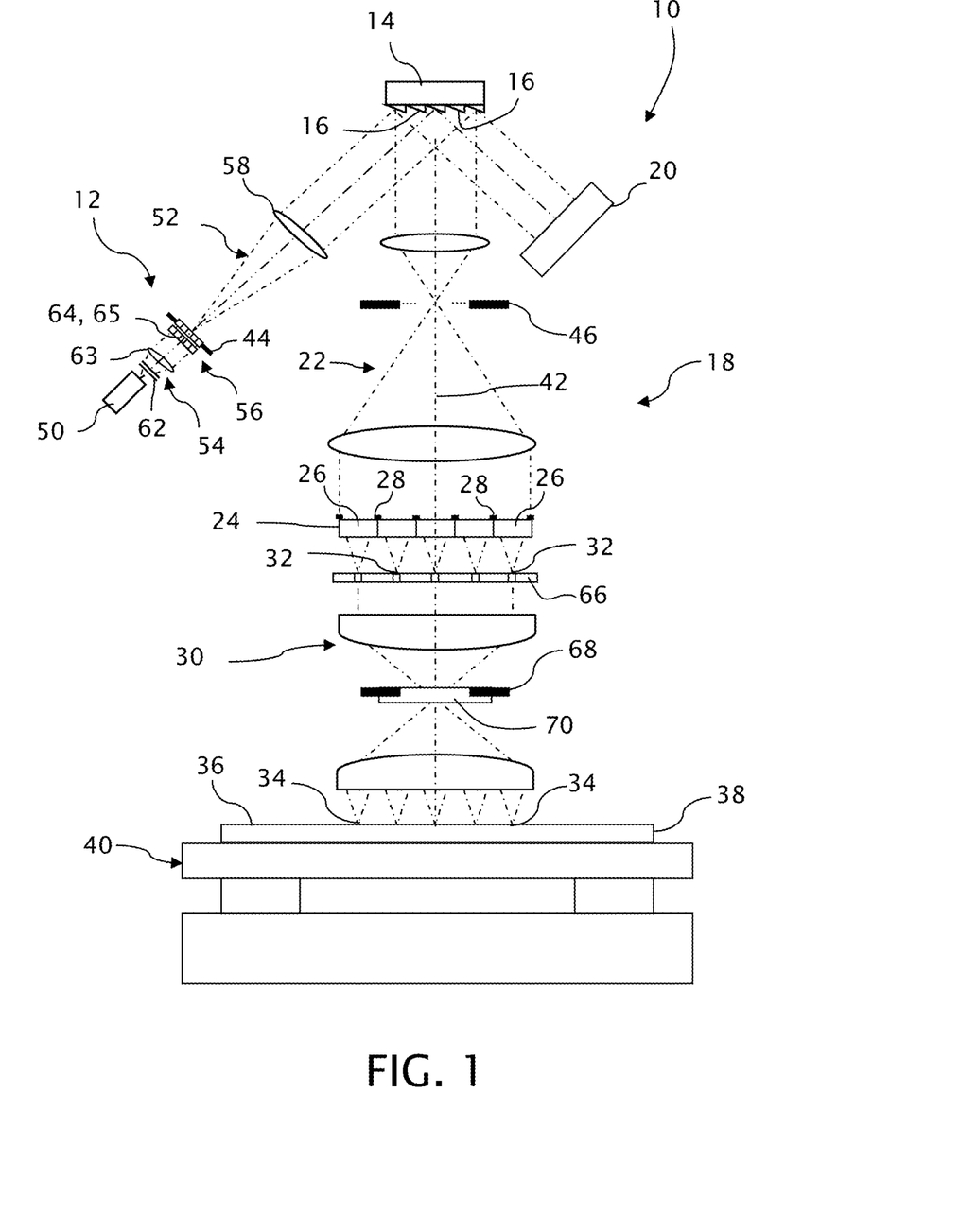
FIG. 1 is a diagram of a maskless lithography system incorporating an apodizer within a relay for optimizing focused spots imaged onto a substrate.

A microlithographic projection system 10, as an example of an active spot array projection system, is adapted in accordance with the invention for projecting patterns of well-formed spots. A pattern generator 14, including individually addressable elements 16, receives homogenized light from an illuminator 12 for directing discrete portions of the light to either a projector 18 or a beam dump 20, depending on the addressable states of the elements 16.

An imager 22 of the projector 18 images the addressable elements 16 of the pattern generator 14 onto corresponding microlenses 26 of a microlens array 24. A sufficient numerical aperture (e.g., 0.08 or higher) is chosen for the imager 22 to accurately reproduce magnified images of the addressable elements 16 on the microlenses 26 without significant crosstalk or overlap onto adjacent microlenses 26. Field stops 28 surround the entrance apertures of the microlenses 26 to block light scattered from edges of the addressable elements 16. A relay 30 images focal points 32 of the microlenses 26 as a pattern of focused spots 34 on a surface 36 of light-sensitive substrate 38. A stage 40 relatively translates the light-sensitive substrate 38 along one or more orthogonal axes with respect to the pattern of focused spots 34. Although not shown, the projector 18 is preferably translatable with respect to the stage 40 along an optical axis 42 of the projector 18 for adjusting the focused spots 34 to their intended positions on the substrate surface 36 (i.e., locate the image plane of the relay at the substrate surface 36).

The pattern generator 14, which is preferably a type of spatial light modulator, can take a variety of forms for modulating transmissions or reflections based on a number of different mechanisms including phase-shifting, diffraction, polarization modulation, shuttering, or directional reflection. Depicted as a programmable mirror array, the pattern generator 14 is preferably a digital micromirror device of a type sold by Texas Instruments Incorporated as DLP® technology.

The illuminator 12 includes (a) an extended light source 50, which emits an expanding beam 52, (b) a profiler 54 for further shaping the beam 52, (c) a uniformizer 56 for integrating light within the beam 52, and (d) a combiner 58 for conveying the integrated light of the beam 52 to the pattern generator 14. The extended light source 50 preferably includes a cluster of light emitters arranged in an array having an aspect ratio matching the aspect ratio of the pattern generator 14. For example, a plurality of laser diodes (not shown) can be coupled to a set of multimode optical fibers (not shown) with light emitting ends that are bundled into the desired array. Alternatively, single light sources or other combinations of light sources can be used to inject light into the illuminator 12. The profiler 54 can include a diffuser 62 in concert with a collecting lens 63 coupling light into the uniformizer 56 over an area of the illuminator aperture stop 44. The uniformizer 56 is preferably an imaging type homogenizer assembled from two fly's eye arrays 64 and 65. Additional details of a preferred illuminator for a microlithography system are disclosed in co-assigned U.S. Patent Application 61/130,363 on May 30, 2008 entitled Illumination System for Sizing Focused Spots of a Patterning System for Maskless Lithography, which is hereby incorporated by reference.

The illuminator 12 has a numerical aperture at the pattern generator 14 that is less than the numerical aperture of the imager 22 at the pattern generator 14. The illuminator aperture stop 44 is conjugate to (a) an aperture stop 46 of the imager 22, (b) the focal points 32 of the microlens array 24, and (c) the focused spots 34 on the substrate surface 36. As such, the illuminator aperture stop 44 is imaged within the imager aperture stop 46 at a size less than a size of the imager aperture stop 46. The illuminator 12 underfills the aperture stop 46 of the imager 22 in a ratio of apertures (illumination aperture diameter to imager aperture diameter) referred to as a partial coherence parameter σ of the addressable elements 16.

Although the illuminator 12 underfills the imager aperture stop 46, light enters the remainder of the imager aperture stop 46 as a consequence of irregularities and peripheral boundaries of the addressable elements 16 of the pattern generator 14. For example, the micromirrors of a digital micromirror device include reflective surfaces that contain departures from flatness and boundaries in the form of edges. The departures from flatness tend to tip local reflected distributions of light to include higher angles of reflection and light is diffracted from the edges through a higher range of angles. Light entering the imager 22 through the higher angles of reflection and diffraction fill areas of the imager aperture stop 46 beyond the area that would otherwise be filled by the image of the illuminator aperture stop 44.

A spatial filter 66 in a focal plane of the microlens array 24 eliminates high spatial frequencies and stray light that does not appropriately converge through the focal points 32. The spatial filter 66 can be formed as an array of holes. The relay 30 images the output of the spatial filter 66, comprising a pattern of focused spots, onto the substrate surface 36.

At or near an aperture stop 68 of the relay 30, which appears as a pupil of the relay 30, an apodizer 70, preferably in the form of an apodizer variably modulates light within the relay aperture stop 68. Spatial frequencies that contribute to the formation of the focused spots 34 are radially ordered within the aperture stop 68 with lower spatial frequencies approaching the optical axis 42 and higher spatial frequencies approaching a periphery 72 of the aperture stop 68.

A wide range of spatial frequencies is required to reproduce the focused spots 34 to the smallest size. Irregularities in the individually addressable elements 16 or anomalies elsewhere in the projector 18 can imbalance distributions of light among the spatial frequencies in different directions across the aperture stop 68 resulting in malformed focused spots. Radial distributions of the spatial frequencies that contribute to the sharpness of the focused spots can also be disrupted by the various irregularities or anomalies of the projector 18.

Figure 2A:
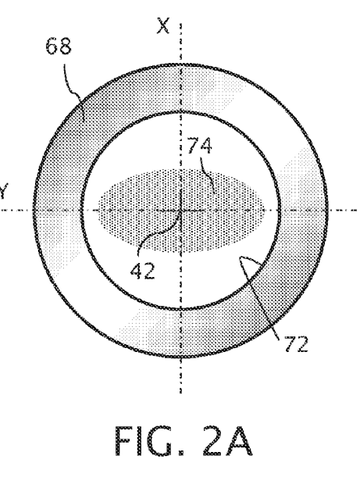
FIG. 2A is an enlarged view of a relay pupil showing an asymmetric distribution of spatial frequencies within the relay aperture stop.
Figure 2B:
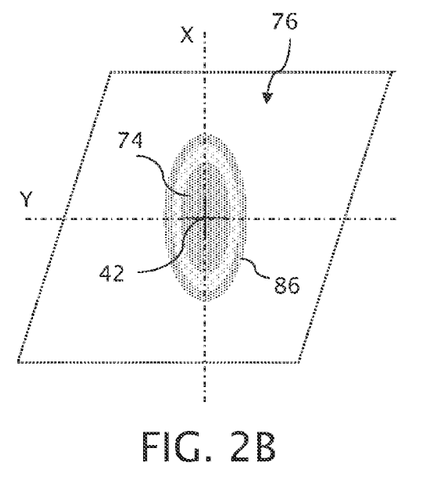
FIG. 2B is a similarly enlarged view of a focused spot in the relay image plane arising from the asymmetric spatial frequency distribution.

For example, FIGS. 2A and 2B show the effects of an uneven distribution of spatial frequencies within the relay aperture stop 68 on the formation of a focused spot 74 in the image plane 76 at the substrate surface 36. As shown in FIG. 2A, light is distributed within the relay aperture stop 68 in an oblong pattern signifying that a wider range of spatial frequencies is available in an arbitrary X-axis orientation across the aperture stop 68 with respect to an orthogonal Y-axis orientation across the aperture stop 68 for forming the focused spot 74. As shown in FIG. 2B, the wider range of spatial frequencies in the X-axis orientation direction across the aperture stop 68 contribute to the formation of a narrower focused spot 74 in the corresponding X-axis orientation of the image plane 76. Conversely, the narrower range of spatial frequencies in the Y-axis orientation direction across the aperture stop 68 contribute to the formation of a wider focused spot 74 in the corresponding Y-axis orientation of the image plane 76.

Generally, the focused spots 34 or 74 are preferably more symmetrical in dimension, e.g., circular, for projecting patterns onto the surface 36 of the substrate 38 having more uniform resolution in the different orthogonal orientations. The invention in a preferred form provides for modulating light passing through the aperture stop 68 en route to the image plane 76 for balancing ranges of spatial frequencies in the different orientations about the optical axis 42.

Figure 3A:
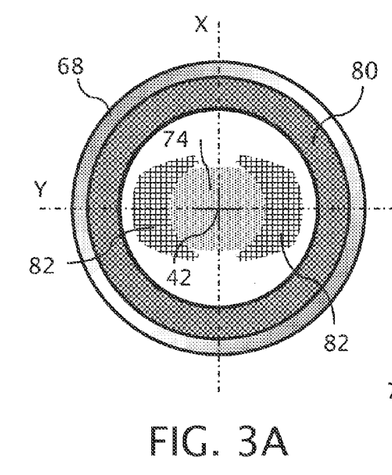
FIG. 3A is an enlarged view of the relay pupil showing the apodizer arranged for asymmetrically attenuating spatial frequency imbalances within the relay aperture stop.
Figure 3B:
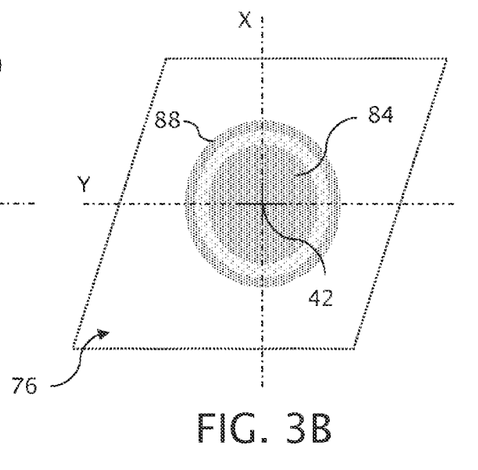
FIG. 3B is a similarly enlarged view of a reformed focused spot in the relay image plane arising from the corrected spatial frequency distribution.

While either amplitude or phase modulation can be used, an apodizer 80 is shown in FIG. 3A having an attenuation pattern 82 for attenuating the extended range of spatial frequencies in the X-axis orientation direction across the aperture stop 68. The resulting focused spot 84 is correspondingly enlarged in the X-axis orientation to match its largely unaffected dimension in the Y-axis orientation. Although the modulated spot 84 occupies a larger overall area than the focused spot 74, the shape of the spot 84 is much closer to the desired circular form.

The amount of correction required can be determined by simulation or measured empirically. For example, the spot shape can be predicted from conventional lens design software or can be measured from static images produced in the photosensitive surface 36 of the substrate 38 or another arranged for this purpose.

In addition to producing a symmetric shape, the energy distribution of the spots 34 also preferably produces an abrupt boundary for the spots so that the spots can form sharply defined images in the photosensitive surface 36 of the substrate 38. However, also apparent in the patterns of the focused spots 74 and 84 is a radial intensity variation arising from distribution of light among the different spatial frequencies. For example, as the focused spots 74 or 84 approach a diffraction limited size, diffraction rings or "side lobes" tend to form near boundaries 86 and 88 of the focused spots 74 and 84, which decrease the sharpness with which the spots 74 or 84 can form sharply defined images in the photosensitive surface 36 of the substrate 38.

Figure 4A:
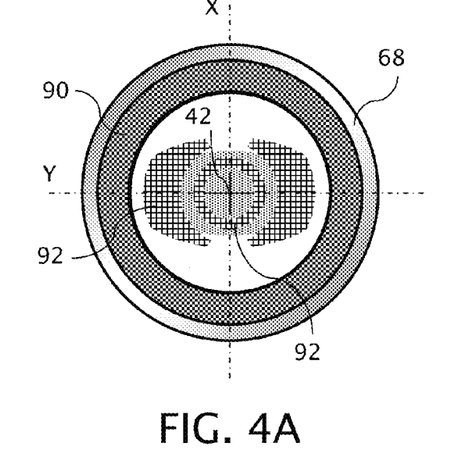
FIG. 4A is an enlarged view of the relay pupil showing a further modified apodizer for symmetrically attenuating certain spatial frequency within the relay aperture stop.
Figure 4B:
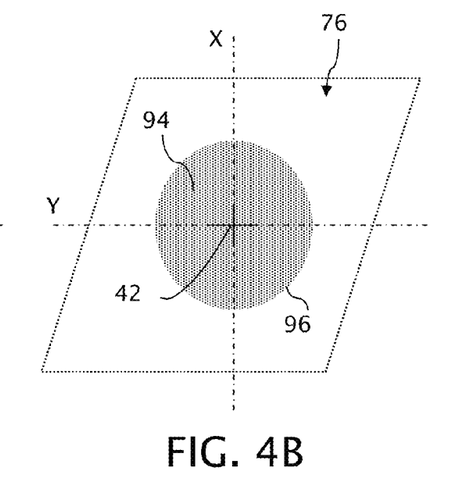
FIG. 4B is a similarly enlarged view of a further reformed focused spot in the relay image plane arising from the symmetrically corrected spatial frequency distribution.

As shown in FIGS. 4A and 4B, an alternative apodizer 90, as a further modification of the apodizer 80, can be arranged to include an annular attenuation pattern 92 including one or more attenuation rings to attenuate certain spatial frequencies in a substantially radially symmetric manner. The removed spatial frequencies reduce the ringing or side lobes of energy distribution within the spot 94, which would otherwise accompany a fuller range of spatial frequencies. As such, the modified focused spot 94 has a more abrupt boundary 96 for concentrating light energy within the intended dimensions of the focused spot. Similar symmetric apodization patterns can be applied for distributing light energy more uniformly within the focused spot 94. The symmetric and asymmetric modifications to the spatial frequency distributions within the relay aperture stop 68 can be made separately or in combination as shown in the apodizer 90 of FIG. 4A.

Figure 5:
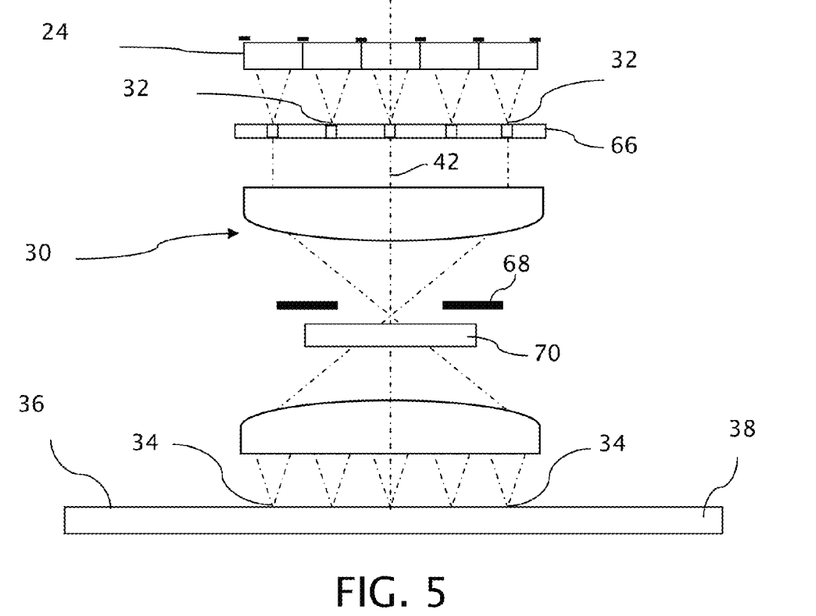
FIG. 5 is an isolated view of the relay showing the apodizer offset from the relay aperture stop for differentially affecting energy distributions among the focused spots.

Although the apodizers 80 and 90 are intended for attenuating selected spatial frequencies appearing in various symmetric or asymmetric orientations within the relay aperture stop 68 for collectively reshaping the focused spots 34, 84 and 94, the apodizers 80 and 90 can be offset from the relay aperture stop 68 in one direction or another along the optical axis 42 for differentially affecting the focused spots 34 in different portions of the image plane 76. The differential affects on the focused spots 34 in different positions on the image plane 76 can be demonstrated by ray tracing. Combinations of varying attenuation patterns and offsets from the aperture stop 68 can be worked out in conventional lens design software, such as Code V by Optical Research Associates, Pasadena, Calif.; ZEMAX optical design code from Focus Software, Tucson, Ariz.; or OSLO optical design software from Lambda Research Corporation, Littleton, Mass.

The proposed offset of the apodizer 70, in general, or the apodizers 80 or 90, in particular, can also produce intended or unintended intensity variations among the focused spots 34. The illuminator 12 can be modified to compensate for or complement the intensity variations among the focused spots 34, such as by positioning a field filter (not shown) in a plane conjugate to the output of the uniformizer 56.

Figure 6:
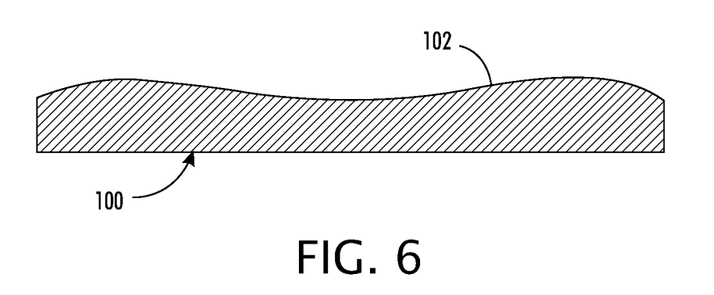
FIG. 6 is a cross-sectional side view of a phase plate for delaying the phases of certain spatial frequencies arranged about an optical axis.

In place of modulating the amplitude of light waves propagating through the relay aperture stop 68 using an apodizer, similar effects on the spot shape and distribution of light within the focused spots can be achieved by modulating the phase of the light waves propagating through the relay aperture stop 68 using a phase plate. For example, a phase plate 100, as shown in FIG. 6, located in the pupil of the relay 30 can improve the formation of the spots 34 by reducing side lobes or extending the depth of focus of the spots 34. The phase plate 100 includes an aspheric surface 102 that delays the propagation of light in some radial zones of the pupil more than other radial zones.

Figure 7:
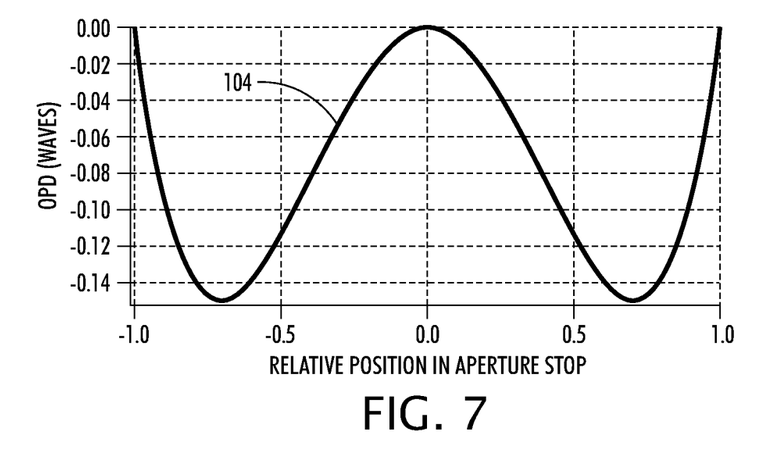
FIG. 7 is a graph plotting a wavefront shape modification in the form of a spherical aberration provided by the phase plate of FIG. 6.

The delay of phase is also known as optical path difference (OPD). FIG. 7 plots an optical path difference 104 imparted by the phase plate 100 upon a wavefront within the pupil intended for convergence to form each of the focused spots 34. The optical path difference 104 imparts a third order spherical aberration that is rotationally symmetric and can be described mathematically using the rotationally symmetric terms of the Zernike polynomial set as follows:

$$OPD = Z_{sph3}(6r^4 - 6r^2 + 1) - Z_{sph3}$$

where coordinate "r" is a radial measure that extends from zero at the center of the pupil to one at the peripheral edge of the pupil, and $Z_{sph3}$ is the Zernike coefficient that is subtracted from the third-order Zernike term to set the optical path difference (OPD) to zero at the center of the pupil.

A rotationally symmetric profile for the aspheric surface 102 of the phase plate 100 relates directly to the target optical path difference (OPD) throughout the pupil. A departure "d" from a plane surface at the radial coordinate "r" is given as follows:

$$d(r) = \frac{OPD}{(n-1)}$$

where "n" is the refractive index of the phase plate 100 and "1" is the approximate refractive index of air. Thus, the desired optical path difference (OPD) is achieved by the phase plate 100 at any radial position by the product of the surface departure "d(r)" and the refractive index difference "n−1" between the phase plate 100 and its immediate optical environment.

Placing the phase plate 100 directly at the relay pupil provides the same modulation to the wavefront forming each of the focused spots 34 across the whole imaging field. If the phase plate 100 is displaced from the pupil (generally along the optical axis 42), then the modulation wavefront would vary over the imaging field as a function of position of the field relative to the optical axis 42. This could be advantageous, if the desired improvements or corrections of the focused spots 34 are not uniform over the imaging field. If the departure "d(r)" is symmetric about the optical axis 42 and the phase plate 100 is displaced from the pupil along the optical axis 42, then the modulation wavefront would vary symmetrically about the optical axis 42 within the imaging field.

Figure 8:
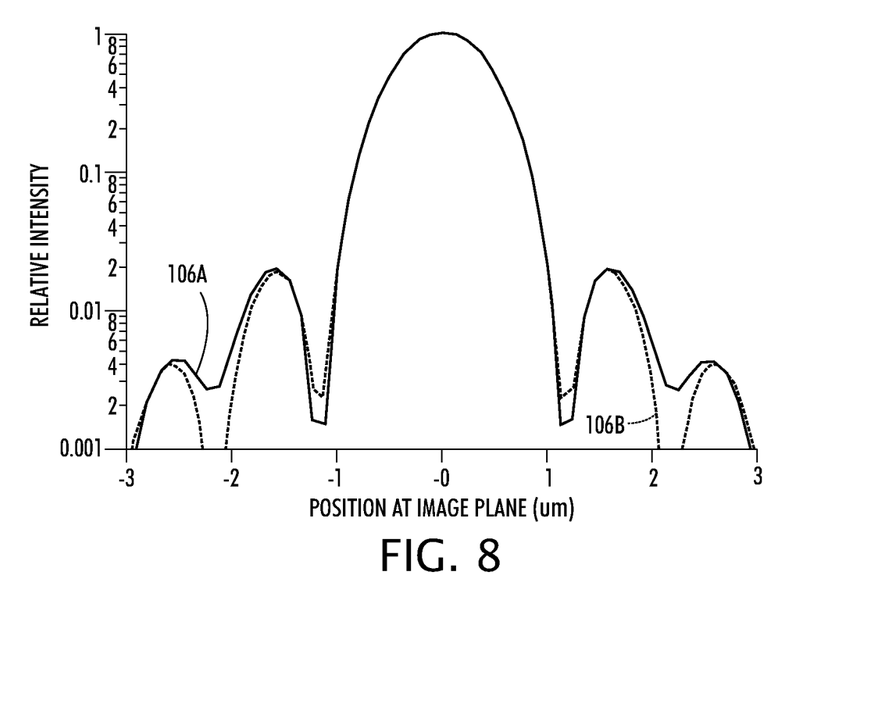
FIG. 8 is a graph of an intensity distribution at an image plane from a single point on an object plane comparing the effects of phase plates similar to the phase plate of FIG. 6 between positive and negative spherical aberration.
Figure 9:
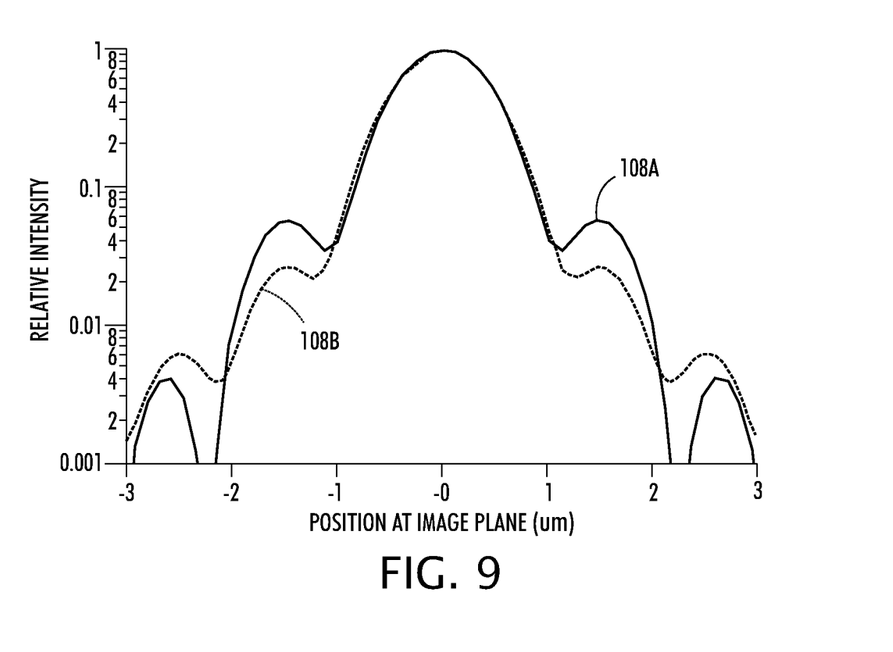
FIG. 9 is a similar graph of an intensity distribution from the same single point at a focal depth beneath the image plane.

The plots of FIGS. 8 and 9 show the effects of opposite sign spherical aberration modulations within the pupil, such as imparted by the phase plate 100 and its oppositely signed counterpart, on the intensity distributions at the substrate surface 36 from one of the focal points 32 of the microlenses 26. The intensity plots are the imaging response from a single object point and are known as point spread functions (PSF). FIG. 8 plots the resulting intensity distributions 106A and 106B (compared as solid and dashed lines) at the image plane of best focus. FIG. 9 plots the resulting intensity distributions 108A and 108B (compared as solid and dashed lines) just beyond the image plane of best focus, displaced, for example, along the optical axis 42 by a distance of 15 μm (microns). The differences between the solid and dashed lines 106A, 106B and 108A, 108B are attributable to opposite signs of spherical aberration added to a typical wavefront by the phase plate 100 and its oppositely signed counterpart. According to this example, the differences 108A and 108B are more significant for influencing intensity distributions beyond the plane of best focus.

The focused spot 34 relayed from the microlens array 24 has a three-dimensional form that can vary in size and intensity distribution through the focus. Since the microlens array 24 is not necessarily telecentric, the focused spots 34 can increase in size faster on one side of best focus than the other. The modulation of spherical aberration by the phase plate 100 alters how the focused spot 34 changes through focus, and can improve the range of the focus (depth of focus) that the intensity distribution of the formed spot is meets the resolution and symmetry criteria of maskless lithography.

The above example only examines one rotational symmetrical shape of modulation of the wavefront for improvement. Virtually any other Zernike term, combination of combination of Zernike terms, or other continuous functions of optical path difference (OPD) could be used to improve the symmetry, side lobes, depth of focus, or other pertinent parameter of maskless lithography. The optimal shape of the focused spots at or through the best focus position can be determined by systematically exploring the space defined by the different Zernike terms within the pupil using available optical design software, such as Code V by Optical Research Associates, Pasadena, Calif.; ZEMAX optical design code from Focus Software, Tucson, Ariz.; or OSLO optical design software from Lambda Research Corporation, Littleton, Mass. The micro-lenses 26 of the microlens array 24 would preferably be included in the model, as well as the effective distribution of field angles incident on the microlens array 24. The later is a function of the illumination fill of the aperture 46 of the imager 18. Diffraction effects of the individually addressable elements 16 (e.g., multiple mirrors) do not influence formation of the focused spots 34 because the light from only a single mirror passes through each microlens 26 of the array 24.

The coefficients of this phase delay in terms of optical path length difference can be optimized to reduce the side lobes or secondary rings in the formation of the spots, and/or can be used to improve the depth of focus. The later is accomplished by reducing the growth of the width of the formed spot with defocus at some defined irradiance level. The use of rotationally asymmetric terms of the Zernike polynomials, particularly those that describe astigmatic aberration can be used to reduce the width of the spot in one lateral dimension. In other words, to correct for elliptical shape of the formed spot in order to produce a more circular spot.

Although described with respect to particular embodiments, those of skill in the art will appreciate the various modifications and additions that can be made.

The invention claimed is:

1. An active spot array projection system comprising
an illuminator for illuminating addressable elements of a pattern generator,
an imager for imaging the addressable elements of the pattern generator onto corresponding focusing elements that form focused spots at focal points of the focusing elements and in a pattern controlled by the pattern generator,
a relay for relaying an image of the pattern of focused spots, each containing a range of spatial frequencies, onto a photosensitive substrate, and
a frequency modulator proximate to a pupil of the relay for collectively modulating selected spatial frequencies in selected positions appearing inside the pupil of the relay for adjusting a shape of the focused spots on the photosensitive substrate.

2. The system of claim 1 in which the frequency modulator is an apodizer for attenuating certain spatial frequencies of the focused spots.

3. The system of claim 2 in which the apodizer asymmetrically attenuates certain spatial frequencies about an optical axis of the relay to radially balance spatial frequency distributions within the relay pupil.

4. The system of claim 2 in which the apodizer asymmetrically attenuates certain spatial frequencies about an optical axis of the relay to reduce asymmetric distributions of spatial frequencies within the relay pupil.

5. The system of claim 2 in which the apodizer symmetrically attenuates certain spatial frequencies about an optical axis of the relay to reduce side lobes of the focused spots imaged onto the substrate.

6. The system of claim 1 in which the frequency modulator is a phase plate located proximate to the pupil of the relay for delaying phases of certain spatial frequencies of the focused spots.

7. The system of claim 6 in which the phase plate asymmetrically delays phases of certain spatial frequencies about an optical axis of the relay to reshape the focused spots imaged onto the substrate.

8. The system of claim 6 in which the phase plate symmetrically delays phases of certain spatial frequencies about an optical axis of the relay to reduce side lobes of the focused spots imaged onto the substrate or to reduce variations in defocus.

9. The system of claim 1 in which the frequency modulator is offset from the relay pupil along an optical axis of the relay for disproportionately modulating focused spots in one portion of the pattern of focused spots imaged onto the substrate with respect to another portion of the pattern of focused spots imaged onto the substrate.

10. A method of reforming focused spots within a controllable pattern of focused spots comprising steps of
    illuminating individually addressable elements of a pattern generator with an illuminator,
    imaging the addressable elements of the pattern generator onto corresponding focusing elements for forming focused spots at focal points of the focusing elements in a pattern controlled by the pattern generator,
    relaying the pattern of focused spots, each containing a range of spatial frequencies, through a common pupil and onto a substrate image plane, and
    collectively modulating selected spatial frequencies of the focused spots in selected positions appearing inside the common pupil so that images of the focused spots on the substrate image plane contain altered angular distributions of light for adjusting a shape of the focused spots on the substrate image plane.

11. The method of claim 10 in which the step of collectively modulating includes asymmetrically attenuating certain spatial frequencies about an optical axis of the relay to radially balance spatial frequency distributions within the common pupil.

12. The method of claim 10 in which the step of collectively modulating includes asymmetrically attenuating certain spatial frequencies about an optical axis of the relay to limit asymmetric distributions of spatial frequencies within the common pupil.

13. The method of claim 10 in which the step of collectively modulating includes symmetrically attenuating certain spatial frequencies about an optical axis of the relay to reduce side lobes of the focused spots imaged onto the substrate image plane.

14. The method of claim 10 in which the step of collectively modulating includes asymmetrically delaying phases of certain spatial frequencies about an optical axis of the relay to reshape the focused spots imaged onto the substrate image plane.

15. The method of claim 10 in which the step of collectively modulating includes symmetrically delaying phases of certain spatial frequencies about an optical axis of the relay to reduce side lobes of the focused spots imaged onto the substrate image plane or to reduce variations in defocus.

16. The method of claim 10 including a step of offsetting a frequency modulator from the common pupil for disproportionately modulating focused spots in one portion of the pattern of focused spots imaged onto the substrate image plane with respect to another portion of the pattern of focused spots imaged onto the substrate image plane.

17. The method of claim 10 including a step of determining an orientation at which the imaged spots are elongated at the substrate image plane, and the step of collectively modulating includes modulating spatial frequencies in an orthogonal orientation within the common pupil to reform the imaged spots into a less elongated shape.

18. In a maskless microlithographic projection system that produces a controllable array of focused spots for imaging patterns onto photosensitive substrates, an improvement comprising
    an imager for imaging addressable elements of a pattern generator onto corresponding focusing elements that form an array of focused spots at focal points of the focusing elements and in a pattern controlled by the pattern generator,
    a frequency modulator positioned within a relay of a projection lens that relays an image of the array of focused spots onto a photosensitive substrate, and
    the frequency modulator being arranged for collectively modulating selected spatial frequencies of the focused spots in selected positions appearing inside a pupil of the relay.

19. The projection system of claim 18 in which the frequency modulator asymmetrically modulates the selected spatial frequencies about an optical axis of the relay for collectively correcting a shape of the focused spots that are imaged onto the photosensitive substrate.

20. The projection system of claim 18 in which the frequency modulator symmetrically modulates the selected spatial frequencies about an optical axis of the relay for collectively redistributing light within the focused spots.

21. The projection system of claim 18 in which the frequency modulator is offset from an aperture stop of the relay for differentially modulating spatial frequencies among the focused spots of the array of focused spots.

22. The projection system of claim 18 in which the frequency modulator is arranged as an apodizer for asymmetrically attenuating certain spatial frequencies about an optical axis of the relay.

23. The projection system of claim 18 in which the frequency modulator is arranged as a phase plate for asymmetrically delaying phases of certain spatial frequencies about an optical axis of the relay.

* * * * *